(12) United States Patent
Luo et al.

(10) Patent No.: US 7,397,270 B1
(45) Date of Patent: *Jul. 8, 2008

(54) DYNAMICALLY-ADJUSTABLE DIFFERENTIAL OUTPUT DRIVERS

(75) Inventors: Mei Luo, San Jose, CA (US); Sergey Shumarayev, San Leandro, CA (US); Wilson Wong, San Francisco, CA (US); Chong H. Lee, San Ramon, CA (US)

(73) Assignee: Altera Corporation, San Jose, CA (US)

( * ) Notice: Subject to any disclaimer, the term of this patent is extended or adjusted under 35 U.S.C. 154(b) by 319 days.

This patent is subject to a terminal disclaimer.

(21) Appl. No.: 11/138,919

(22) Filed: May 25, 2005

Related U.S. Application Data

(63) Continuation of application No. 10/670,146, filed on Sep. 24, 2003, now Pat. No. 6,943,588.

(51) Int. Cl.
*H03K 19/094* (2006.01)
(52) U.S. Cl. .................. 326/32; 326/86; 326/115; 326/127; 326/30; 326/21; 327/112; 327/108
(58) Field of Classification Search ............ 326/86, 326/115, 127; 327/108
See application file for complete search history.

(56) References Cited

U.S. PATENT DOCUMENTS

| 5,955,911 | A | 9/1999 | Drost et al. |
| 5,977,796 | A | 11/1999 | Gabara |
| 6,005,438 | A | 12/1999 | Shing |
| 6,236,231 | B1 | 5/2001 | Nguyen et al. |
| 6,362,644 | B1 | 3/2002 | Jeffery et al. |
| 6,433,579 | B1 * | 8/2002 | Wang et al. .................. 326/38 |
| 6,437,599 | B1 | 8/2002 | Groen |
| 6,448,815 | B1 | 9/2002 | Talbot et al. |
| 6,515,508 | B1 | 2/2003 | Chang et al. |
| 6,531,892 | B2 | 3/2003 | Ghia et al. |
| 6,590,422 | B1 | 7/2003 | Dillon |
| 6,600,346 | B1 | 7/2003 | Macaluso |
| 6,603,329 | B1 | 8/2003 | Wang et al. |
| 6,700,403 | B1 | 3/2004 | Dillon |
| 6,720,805 | B1 | 4/2004 | Haas |
| 2002/0170011 | A1 | 11/2002 | Lai et al. |
| 2003/0085737 | A1 * | 5/2003 | Tinsley et al. .................. 326/86 |
| 2004/0123197 | A1 | 6/2004 | Sunter et al. |
| 2004/0246026 | A1 * | 12/2004 | Wang et al. .................. 326/86 |
| 2006/0125533 | A1 * | 6/2006 | Kim et al. .................... 327/112 |

* cited by examiner

*Primary Examiner*—Vibol Tan
(74) *Attorney, Agent, or Firm*—Treyz Law Group; G. Victor Treyz (57) ABSTRACT

Systems and methods are provided using dynamically adjustable differential output drivers. Integrated circuits such as programmable logic devices may be provided with adjustable differential output drivers for transmitting high-speed data to other integrated circuits. The peak-to-peak output voltage and common-mode voltage of the output drivers may be adjusted. Dynamic control circuitry may be used to control the settings of current sources, programmable resistors, and voltage source circuitry in the adjustable differential output driver automatically in real time. The adjustable components in the differential output driver may be adjusted by the dynamic control circuitry based on feedback information received from the integrated circuit to which the data is transmitted.

11 Claims, 8 Drawing Sheets

DYNAMICALLY-ADJUSTABLE DIFFERENTIAL OUTPUT DRIVERS

This application is a continuation of patent application Ser. No. 10/670,146, filed Sep. 24, 2003, now U.S. Pat. No. 6,943,588 which is hereby incorporated by reference herein in its entirety.

BACKGROUND OF THE INVENTION

This invention relates to input-output (I/O) circuitry for integrated circuits, and more particularly, to differential output drivers that may be adjusted dynamically during circuit operation.

Input-output (I/O) circuitry is used on integrated circuits as an interface between the circuitry on the integrated circuit and external components. Input-output circuitry typically includes either single-ended or differential input drivers and single-ended or differential output drivers.

Single-ended drivers are used to handle single-ended signals—i.e., signals that are referenced to ground.

Differential drivers are used to handle differential signals, which are carried on pairs of conductors. Differential signals are referenced to each other, rather than a source of ground potential. One of the differential signals in each differential signal pair may be labeled "positive" and the other one of the differential signals in that pair may be labeled "negative."

The average voltage of a differential signal is called its "common mode" voltage ($V_{CM}$). The maximum voltage swing of a differential output signal (i.e., the voltage difference between the maximum and minimum of a differential output signal) is called its peak-to-peak output voltage ($V_{OD}$).

There is a class of integrated circuits known as programmable logic devices. These integrated circuits have programmable circuitry that can be programmed by a user to perform custom logic functions. With one common arrangement, a programmable logic device can be configured by loading configuration data into the programmable logic device from an external memory chip upon system power-up.

The I/O circuitry of many programmable logic devices contains differential input and output drivers. The differential I/O circuitry of a programmable logic device may be used to support high-speed communications between the programmable logic device and an external component such as an application-specific integrated circuit (ASIC).

There are a number of different differential I/O signaling standards in use in modern systems. Examples of popular I/O signaling standards include the LVDS and LVPECL standards. These standards typically use different values for the common-mode voltage $V_{CM}$ and the peak-to-peak output voltage swing $V_{OD}$.

In order to make programmable logic devices that support differential I/O signaling standards more flexible, some of these programmable logic devices have programmable I/O circuitry. During device programming, the programmable I/O circuitry can be configured to handle the values of $V_{CM}$ and $V_{OD}$ that are required by a particular I/O signaling standard.

In modern system environments, integrated circuits may be connected using a variety of different communications paths. Some integrated circuits may be mounted close to each other (e.g., in adjacent positions on the same circuit board). Other integrated circuits may be mounted on different boards that are interconnected using system busses. In order to accommodate the wide range of potential system environments in which an integrated circuit is expected to operate, differential signaling standards allow the values of $V_{CM}$ and $V_{OD}$ on different paths to vary somewhat, so long as these values remain within certain prescribed ranges.

The flexibility inherent in such differential signaling schemes ensures a certain minimum level of I/O signaling performance in most circumstances. However, in some situations such as when communications paths are packed densely or when the signals are large, a communications path may be subject to the undesirable effects of crosstalk. In other situations, such as when the I/O signals are weak or when the length of the communications path is large, there may be undesirable noise present. These undesirable effects may arise even at values of $V_{CM}$ and $V_{OD}$ that fall within a prescribed signaling standard range.

It would therefore be desirable to be able to adjust the values of common-mode voltage and peak-to-peak output voltage swing that are produced by a given differential output driver to accommodate different system environments.

SUMMARY OF THE INVENTION

In accordance with the present invention, adjustable differential output drivers are provided. The output drivers may be used to produce differential output signals on communications paths having pairs of signal lines. The differential output signal on each communications path may be characterized by a common-mode voltage $V_{CM}$ and a maximum peak-to-peak voltage swing $V_{OD}$. The output driver on a path may be adjusted to change $V_{CM}$ and/or $V_{OD}$ to accommodate different system environments (e.g., system environments with excessive crosstalk or signal-path noise).

If desired, the output driver may be dynamically controlled using dynamic control circuitry. The dynamic control circuitry can be used to change the values of $V_{CM}$ and/or $V_{OD}$ that the output driver produces in real time.

With one suitable arrangement, a real-time feedback signal may be provided to the dynamic control circuitry. For example, an adjustable output driver may be located on a first integrated circuit such as a programmable logic device integrated circuit and a corresponding receiver may be located on a second integrated circuit. The first and second integrated circuits may be interconnected by a differential signaling path. The differential signaling path may be located on a single circuit board on which the first and second integrated circuits are mounted or, if the first and second integrated circuits are located on different boards, the differential signaling path may be used to interconnect the first and second integrated circuits across a system bus or backplane.

The first circuit may contain dynamic control circuitry for controlling the output driver. The dynamic control circuitry may be hard-wired, may be based on configured programmable logic circuitry (e.g., when the first integrated circuit is a programmable logic device), or may include hard-wired and programmed logic circuitry. The second circuit may include monitoring and feedback circuitry. The monitoring and feedback circuitry may, for example, be used to monitor the quality of the received signal or to measure another suitable parameter related to the quality of the communications link between the first and second integrated circuits over the communications path.

With one suitable arrangement, the monitoring and feedback circuitry may be used to measure the signal to noise ratio of the incoming differential signal from the first integrated circuit. With another suitable arrangement, the monitoring and feedback circuitry on the second integrated circuit may measure the value of $V_{CM}$ and/or $V_{OD}$ for the received differential signal.

The measurements made at the second integrated circuit may be fed back to the dynamic control circuitry of the first integrated circuit. The feedback signals may be unprocessed or slightly processed measurements made by the monitoring and feedback circuitry on the second circuit or may be more heavily processed, downstream signals that are based on raw measurements. The feedback signals may be provide from the second circuit to the first circuit as analog and/or digital signals over any suitable communications path. If desired, the feedback signals may be provided to the first circuit in real time so that the first circuit can adjust the output driver in real time accordingly.

The dynamic control circuitry may use the feedback signals or other information from the second circuit and/or signals from local sources to determine how best to control the output driver. For example, if the feedback signals indicate that the signal at the second integrated circuit's receiver is weak or noisy, the dynamic control circuitry can increase the strength of the output signal. The second integrated circuit may provide the first integrated circuit with information on the common mode voltage level (i.e., a desired or optimum level) for that circuit's differential input driver. The first integrated circuit may use this information to adjust the common-mode voltage of its differential output driver until it matches the common-mode voltage level of the second integrated circuit's input driver.

The differential output driver may contain adjustable output resistors, an adjustable current source, and an adjustable common-mode voltage source. The common mode voltage of the differential output driver can be adjusted by the dynamic control circuitry by adjusting the voltage produced by the common-mode voltage source.

The output resistors can be adjusted to match the impedance of the differential signal line pair that connects the integrated circuit to external components (e.g., to match the impedance of the communications path between the first and second integrated circuits in the example above).

The current sources produce a current that flows through the output resistors. The value of the current produced by the current sources can be selected to adjust the peak-to-peak output voltage swing ($V_{OD}$). The resistance of the output resistor circuitry can be adjusted independently from the current produced by the adjustable current source circuitry.

With the dynamically adjustable differential output driver, output driver compatibility with receivers in the system can be enhanced. A programmable logic device or other integrated circuit may have multiple different data channels, each with a different system environment and different optimum $V_{CM}$ and $V_{OD}$ settings (even if some of these channels are operated using the same nominal differential signaling standard). Potential mismatches between the common-mode voltage of each output driver and each corresponding input driver on another circuit can be minimized by adjusting the $V_{CM}$ on each channel separately, which helps to reduce DC current flow along signal paths in DC-coupled arrangements.

Optimizing the common-mode voltages and differential output voltages also helps to ensure that the output drivers and input drivers can communicate properly. It is not necessary to reconfigure a programmable logic device that contains dynamically-adjustable output drivers to make the desired signal level changes, because driver adjustments can be made dynamically based on real-time control signals. The dynamically-adjustable differential output driver arrangement provides system designers with the flexibility to adjust output driver parameters based on diverse system requirements.

Further features of the invention, its nature and various advantages will be more apparent from the accompanying drawings and the following detailed description of the preferred embodiments.

DETAILED DESCRIPTION OF THE PREFERRED EMBODIMENTS

The present invention relates to adjustable differential output drivers. The invention also relates to the integrated circuits and systems with which such differential output drivers are used and methods for controlling and using these components.

Figure 1:
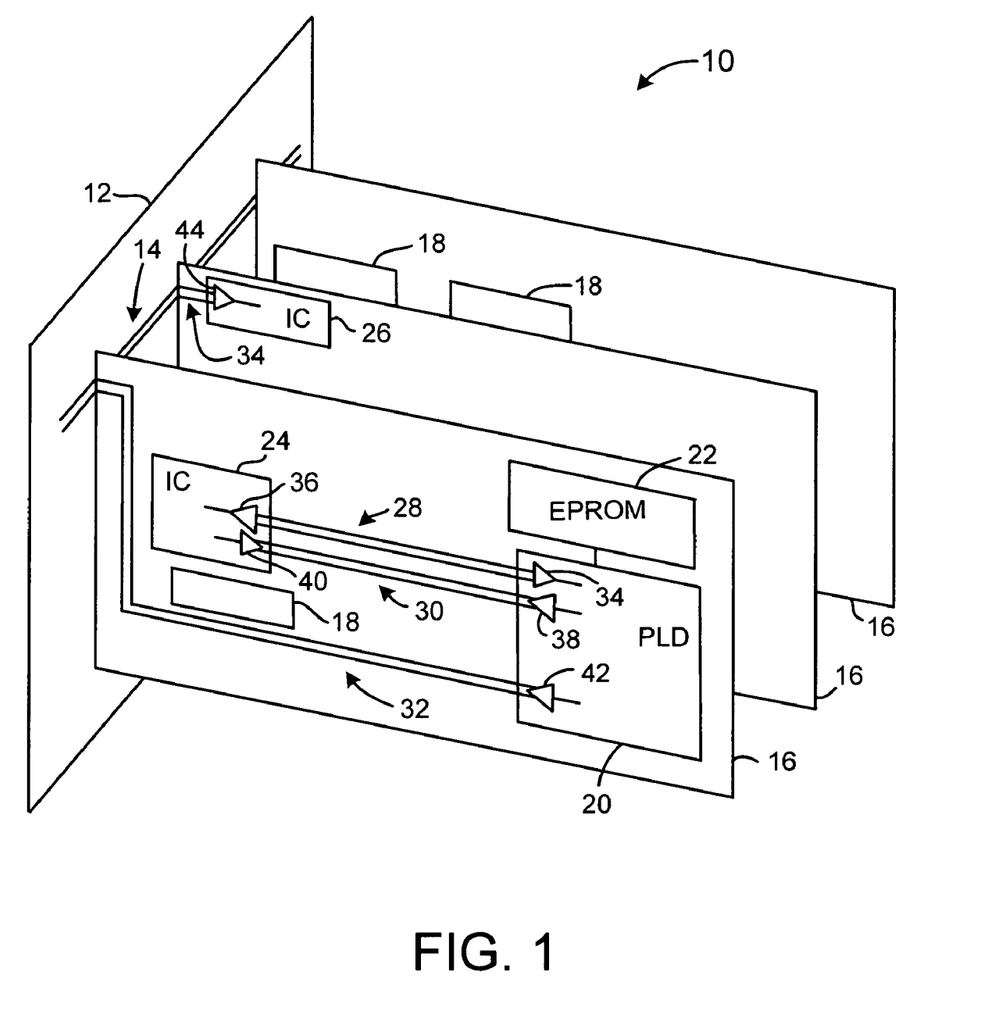
FIG. 1 is a schematic diagram of an illustrative system including an integrated circuit with a dynamically-adjustable differential output driver in accordance with the present invention.

An illustrative system 10 in accordance with the present invention is shown in FIG. 1. In the illustrative system of FIG. 1, a backplane 12 having a bus 14 is used to interconnect a number of circuit boards 16. The bus 14 of FIG. 1 is shown as having only two conductive lines, but busses such as bus 14 typically have many more such lines. These additional lines are not shown in FIG. 1 to avoid over-complicating the drawing.

One or more backplanes such as backplane 12 and circuit boards 16 may be mounted in a system rack or installed in another suitable housing. Circuit boards 16 may be line cards in a telecommunications system, may be circuit boards in a computer, or may be any other module or submodule in a larger system. The arrangement of FIG. 1 is merely illustrative. For example, system 10 need not have a backplane 12, but rather may operate with a single board or other mount for the system components.

Each board 16 typically has a number of integrated circuits 18 and other devices (e.g., switches, discrete components, connectors, etc.). Boards 16 and backplane 12 may be made by different vendors and may have different electrical and physical properties. Integrated circuits are typically provided in packages such as dual-inline packages or other suitable packages. Conductive traces (e.g., copper lines on a typical copper circuit board) may be used to electrically interconnect the components mounted on each board 16.

In the example of FIG. 1, one of the integrated circuits is a programmable logic device 20. Programmable logic device 20 may contain programmable elements that a user may program to configure programmable logic device 20 to perform a desired custom logic function. Some programmable logic devices are based on one-time programmable devices such as fuses or antifuses. Other programmable logic devices are based on electrically-programmable read-only-memory (EPROM) or erasable-electrically-programmable read-only-memory (EEPROM) technology. These devices may be electrically-programmed by applying sufficiently strong signals across appropriate terminals.

Another class of programmable logic device uses random-access-memory (RAM) cells to hold configuration data. The RAM cells may be loaded with configuration data that is provided from an external memory device. For example, when the system is powered-up or at another appropriate time, configuration data from the external memory device may be transferred from the external memory device into the programmable logic device to configure the RAM cells in the programmable logic device. Each of the RAM cells may control a transistor or other element on the programmable logic device, so by configuring the RAM cells, one can selectively turn on and off portions of the circuitry in the programmable logic device and thereby customize its functions as needed.

In the example of FIG. 1, a programmable logic device 20 that has an associated external memory device (an EPROM 22) is shown. This is, however, merely illustrative. Programmable logic devices such as device 20 may be based on any suitable programmable logic device technology.

Moreover, the output driver and control circuitry that is described as working with programmable logic devices may, if desired, be implemented in other types of integrated circuits, such as memory devices, application specific integrated circuits, digital signal processors, microprocessors, analog circuits, digital circuits, communications chips, etc. Such circuits may, for example, be constructed to contain the output driver circuitry of the present invention in combination with the other circuitry used for performing their desired functions (e.g., DSP circuitry on a digital signal processor, microprocessor circuitry on a microprocessor, etc.).

Accordingly, although the present invention is often described in the context of differential output drivers on programmable logic devices for clarity, the present invention also applies to output driver arrangements on any other suitable integrated circuits.

As shown in FIG. 1, programmable logic device 20 may communicate with other integrated circuits such as integrated circuits 24 and 26 (labeled "IC"). Circuits 24 and 16 may be programmable logic devices or other types of integrated circuits such as memory devices, application specific integrated circuits, digital signal processors, microprocessors, analog circuits, digital circuits, communications chips, etc.

The integrated circuits on boards 16 such as integrated circuits 18, 24 and 26 and programmable logic device 20 contain I/O (input-output) circuitry for supporting communications with other system components. Some of the I/O circuitry may be single-ended communications circuitry in which signals are referenced to ground. Other circuitry, particularly high-speed circuitry, may be based on so-called differential signaling arrangements.

With differential signaling, signals are referenced to each other, not to ground. A differential signal path therefore generally contains two conductive lines. In the following discussion, these lines are often referred to as "positive" and "negative" lines, but other notations could be used if desired.

In the illustrative arrangement of FIG. 1, integrated circuit 24 communicates with programmable logic device 20 using differential signal path 28 and differential signal path 30. Only a few illustrative paths are shown in FIG. 1 and the other FIGS. to avoid complicating the drawings. A typical system 10 may have numerous high-speed differential signal paths each supporting a different data channel.

Some of the I/O circuitry of integrated circuit 24 is output circuitry. An illustrative differential output driver 36 is used by integrated circuit 24 to transmit high-speed differential signals to programmable logic device 20 over the pair of signal lines in differential signal path 28. The programmable logic device 20 has a differential input driver 34 that receives the differential signals from path 28 and that converts these signals into signals appropriate for use by the internal circuitry of programmable logic device 20.

Other I/O circuitry on integrated circuit 24 is differential input circuitry. An illustrative differential input driver 40 is used to receive differential signals from differential output driver 38 of programmable logic device 20 over the pair of signal lines in differential signal path 30.

Input and output drivers are sometimes referred to as buffers. Output drivers are sometimes also referred to as transmitters. Input drivers may be referred to as receivers. Generally the term "drivers" will be used herein for clarity.

In the example of FIG. 1, circuit 24 and programmable logic device 20 are on the same board 16 and use differential signaling to communicate over paths such as paths 28 and 30. Programmable logic device 20 may also use differential signaling to communicate with integrated circuits on other boards 16. For example, programmable logic device 20 may send and receive signals to and from an integrated circuit such as integrated circuit 26 via bus 14 and backplane 12. Differential input signals from circuit 26 may be received using a differential input driver similar to driver 34. Differential output signals from programmable logic device 20 may be transmitted to circuit 26 using differential output driver 42. Signals from driver 42 may be transmitted to circuit 26 over the communications path made up of conductive traces 32, bus 14, and conductive traces 34.

In the illustrative arrangement of FIG. 1, the differential input drivers are shown as having dual (differential) inputs leading to a single output that passes signals to the main circuitry of the integrated circuit. The differential output drivers of FIG. 1 such as drivers 36, 38, and 42 are show as having dual (differential) outputs fed from a single input that receives signals from the main circuitry of the integrated circuit. In general, either single-ended-to-differential or differential-to-differential output drivers may be used in the circuits of system 10.

Figure 2A:
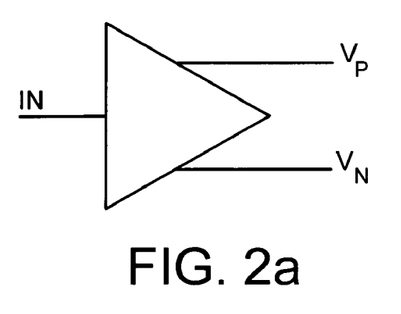
FIG. 2a is a diagram of an illustrative differential output driver with a single-ended input in accordance with the present invention.
Figure 2B:
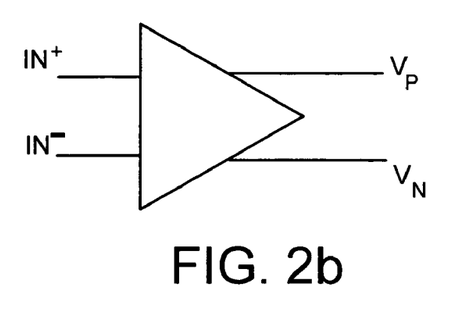
FIG. 2b is a diagram of an illustrative differential output driver with a differential input in accordance with the present invention.

A differential output driver with a single-ended-to-differential configuration is shown in FIG. 2a. The input data line in FIG. 2a, which may be referenced to ground, is labeled "IN." This type of differential output driver is merely illustrative. If desired, the differential output drivers may use a dual-input (differential-input) scheme of the type shown in FIG. 2b. With the approach shown in FIG. 2b, the input signals to the output driver are provided in a differential format (i.e., data is provided to the driver across the IN+ and IN− terminals, which are referenced to each other, rather than to ground).

Regardless of whether a single-ended input or a differential input scheme is used for the output drivers, the output drivers preferably have two differential outputs. These outputs (labeled $V_P$ and $V_N$ in the drawings) are considered to be "differential" outputs, because the signals across terminals $V_P$ and $V_N$ are referenced with respect to each other, rather than to ground.

Figure 3:
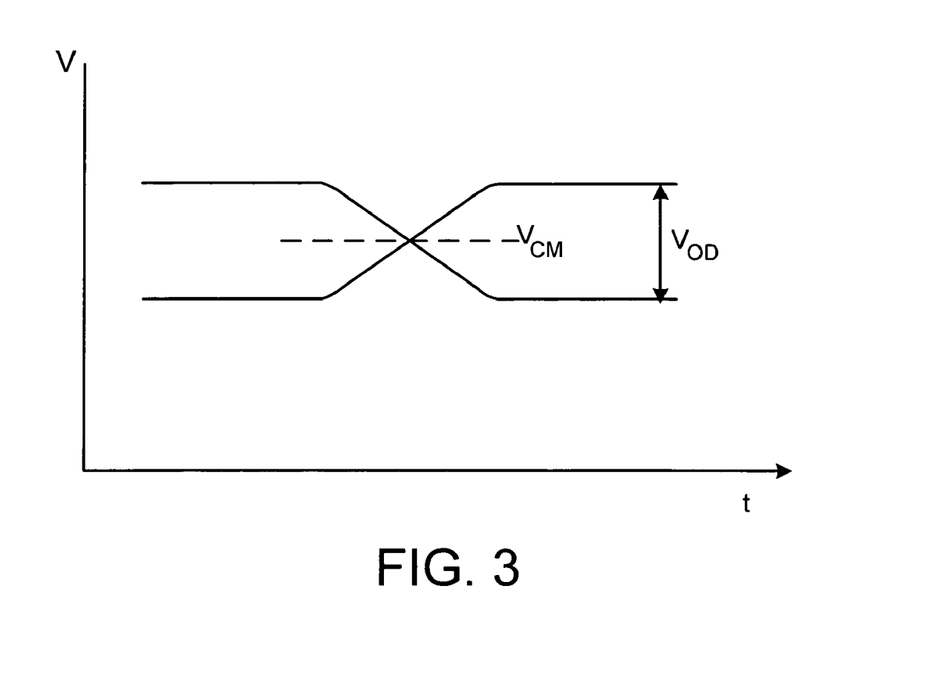
FIG. 3 is a graph showing the common mode voltage $V_{CM}$ and peak-to-peak output voltage swing $V_{OD}$ that can be adjusted in the dynamically-adjustable differential output drivers in accordance with the present invention.

An illustrative graph showing the output voltages of a differential output driver is shown in FIG. 3. As shown in FIG. 3, the output voltages on the terminals $V_P$ and $V_N$ range between a maximum and minimum voltage level. The difference between the maximum and minimum voltage levels (i.e., the maximum voltage swing of the differential output signal) is called the peak-to-peak output voltage swing $V_{OD}$. The average of the voltages on the terminals is called the common-mode voltage $V_{CM}$.

Differential output drivers such as drivers 42 and 38 of programmable logic device 20 may be adjusted. For example, these output drivers can be directed to change the $V_{OD}$ and/or $V_{CM}$ values of their outputs to optimize the performance of the system.

Crosstalk between signal paths can arise in system 10, particularly when signal paths are close to each other. In dense circuit board layouts, it is often necessary for the conductive lines that make up paths such as paths 28, 30, and 32, to be arrayed in parallel across the circuit board. With these arrangements, the signals on one path can electromagnetically couple to an adjacent path. This phenomena, which is known as crosstalk, introduces unwanted spurious signals onto the signal paths.

In a given system environment, crosstalk can be exacerbated by using signal levels that are too high (e.g., differential signals with a maximum voltage swing $V_{OD}$ that is too large). To reduce crosstalk, a system designer can specify that the voltage levels $V_{OD}$ that are used for certain differential output drivers be reduced. As an example, if the layout of the components of system 10 requires that differential signal path 30 be placed particularly close to an adjacent signal path, the system designer (i.e., the user of programmable logic device 20) can specify that the peak-to-peak output voltage $V_{OD}$ that is produced by the differential output driver 38 for its associated data channel should be 10% lower than the peak-to-peak output voltage $V_{OD}$ that is produced by other differential output drivers on programmable logic device 20 for their associated data channels. A system designer may also raise the peak-to-peak output voltage on a channel that is susceptible to crosstalk to improve the signal-to-noise ratio of that channel. The ability to independently adjust $V_{OD}$ levels on different channels allows the system designer to use the maximum possible signal strength on those data channels that are not producing excessive crosstalk, while minimizing crosstalk by selectively lowering the signal strength on certain problematic signal paths.

If desired, all channels in a programmable logic device can be adjusted to use such lower signal strengths, all channels can be adjusted to use nominal or higher signal strengths, or some channels can have lower signal strengths and others can have higher signal strengths.

Sometimes certain communications paths have large attenuations, which reduce signal strengths. In the arrangement of FIG. 1, for example, the inter-board communications path made up of traces 32, bus 14, and traces 34, which links differential output driver 42 of programmable logic device 20 with differential input driver 44 of integrated circuit 26, may have a larger attenuation than shorter paths such as path 30. The attenuation due to such long path lengths may result in signals at the receiving end of the path (e.g., at differential input driver 44 of integrated circuit 26) that are weaker than desired. Weak signals are more susceptible to noise than strong signals and may exhibit lower data rates.

To compensate for the larger attenuation experienced on certain communications paths, the system designer may specify that the corresponding output drivers be adjusted to increase the signal strength on these paths (e.g., by increasing $V_{OD}$), while leaving the signal strength on other paths at their nominal levels. With this approach, signal strength is only raised where needed to counteract larger attenuation and is not raised for all channels on the system, which would lead to other problems such excessive power consumption and crosstalk.

Differential output drivers such as drivers 38 and 42 can also be adjusted to reduce mismatch between the common-mode voltage $V_{CM}$ at the output driver and the common-mode voltage level being used at the corresponding input driver. In DC-coupled systems, if these voltages are not the same, a DC current will flow along the communications path linking the transmitter and receiver. This DC current will lead to undesirable power losses. Moreover, if the values of $V_{CM}$ differ too much between the output driver and the input driver, the common DC level to which these voltages settle may not even be valid at either the output driver or the input driver, preventing proper communications.

The system environments in which integrated circuits such as programmable logic device 20 and the other circuits of FIG. 1 are used vary widely depending on the details of the system involved. By using adjustable differential output drivers, the values of $V_{OD}$ and $V_{CM}$ on different communications channels can be adjusted differently, so that the overall performance of the system can be optimized. Integrated circuits that include the adjustable differential output drivers can be used more flexibly than integrated circuits whose differential output drivers are not adjustable.

The differential output drivers may be adjusted by configuring their internal components using configuration data. When the differential output drivers are part of a programmable logic device that is configured using programming data (e.g., programming data loaded from an external part such as EPROM chip 22 of FIG. 1), the programming data can include configuration bits that control the settings of the differential output drivers.

The differential output drivers may have default settings that are used when a user of device 20 does not wish to make any adjustments to the setting of the differential output drivers. The default settings may be overridden or replaced with user-selected settings when the user desires to operate the differential output drivers with custom settings (e.g., with particular desired settings for the $V_{CM}$ and $V_{OD}$ values associated with the output signals provided by the differential output drivers).

The default settings and the optional user-selected settings may be static settings. For example, the default differential output voltage of a given differential output driver may remain at a particular value of $V_{OD}$, without change, during the entire operation of the differential output driver. As another example, a system designer may determine that some of the differential output drivers should operate with higher-than-usual peak-to-peak output voltages $V_{OD}$ and/or common-mode voltage $V_{CM}$ settings and that other differential output drivers should operate with lower-than-usual peak-to-peak output voltages $V_{OD}$ and/or common-mode voltage $V_{CM}$ settings. The system designer's selections of the operating points for these differential output drivers may be incorporated into the configuration data that is used to program the programmable logic device. When the logic device is programmed, this programming data configures the appropriate differential output drivers to operate at the system-designer-selected settings. These settings may remain essentially unchanged during the operation of the system.

With another suitable approach, the settings of the differential output drivers may be changed dynamically. With this type of approach, control circuitry can be used to adjust the values of $V_{OD}$ and $V_{CM}$ for the differential output drivers in real time. Dynamic control arrangements allow the performance of the differential signal paths in the system 10 to be continually optimized during operation of the system.

The differential output drivers can be controlled in either an open-loop or closed-loop fashion. With an open-loop arrangement, the differential output drivers can be controlled in real time using information and control circuitry that is generally self-contained within the same integrated circuit as the differential output driver. As an example, it may be determined that under certain internal conditions, the differential output drivers should be operated with one set of $V_{CM}$ and $V_{OD}$ settings, whereas under different internal conditions, the differential output drivers should be operated with another set of $V_{CM}$ and $V_{OD}$ settings.

With a closed-loop arrangement, externally-gathered information may be used to help select the appropriate differential output driver settings in real time. As an example, an integrated circuit with which the programmable logic device is communicating may provide the programmable logic device with information on the mismatch between the $V_{CM}$ setting for the output data at the output driver and the common-mode voltage level of the input driver or may provide the programmable logic device with information on the quality of the signal being received. When a high-quality signal is being received, the programmable logic device may be informed that the system is operating properly, so no changes to the settings of the differential output buffers are needed. When a lower-quality signal is being received or when there is a mismatch in the common-mode voltages in DC-coupled systems, the programmable logic device may recognize that the data channel is not operating at an optimum level. The programmable logic device can then adjust the $V_{OD}$ and $V_{CM}$ settings of the differential output drivers accordingly to improve system performance.

The programmable logic device may receive no feedback signals from external sources (pure open-loop control), may receive control signals from both internal and external sources (mixed open-loop and closed-loop control), or may be controlled only through the use of feedback signals (pure closed-loop control). In closed-loop control arrangements, external information for controlling the differential output drivers may be received from one or more external sources. For example, feedback signals may be received from several different integrated circuits in parallel, each of which is communicating with the programmable logic device over a different channel and each of which requires a different type of differential output driver adjustment. For clarity, feedback arrangements are primarily described in the context of communications using a single data channel. This is, however, merely illustrative. In general, any suitable number of feedback sources (and any suitable number of internal control sources) may be used to control the output drivers for multiple channels independently.

Figure 4:
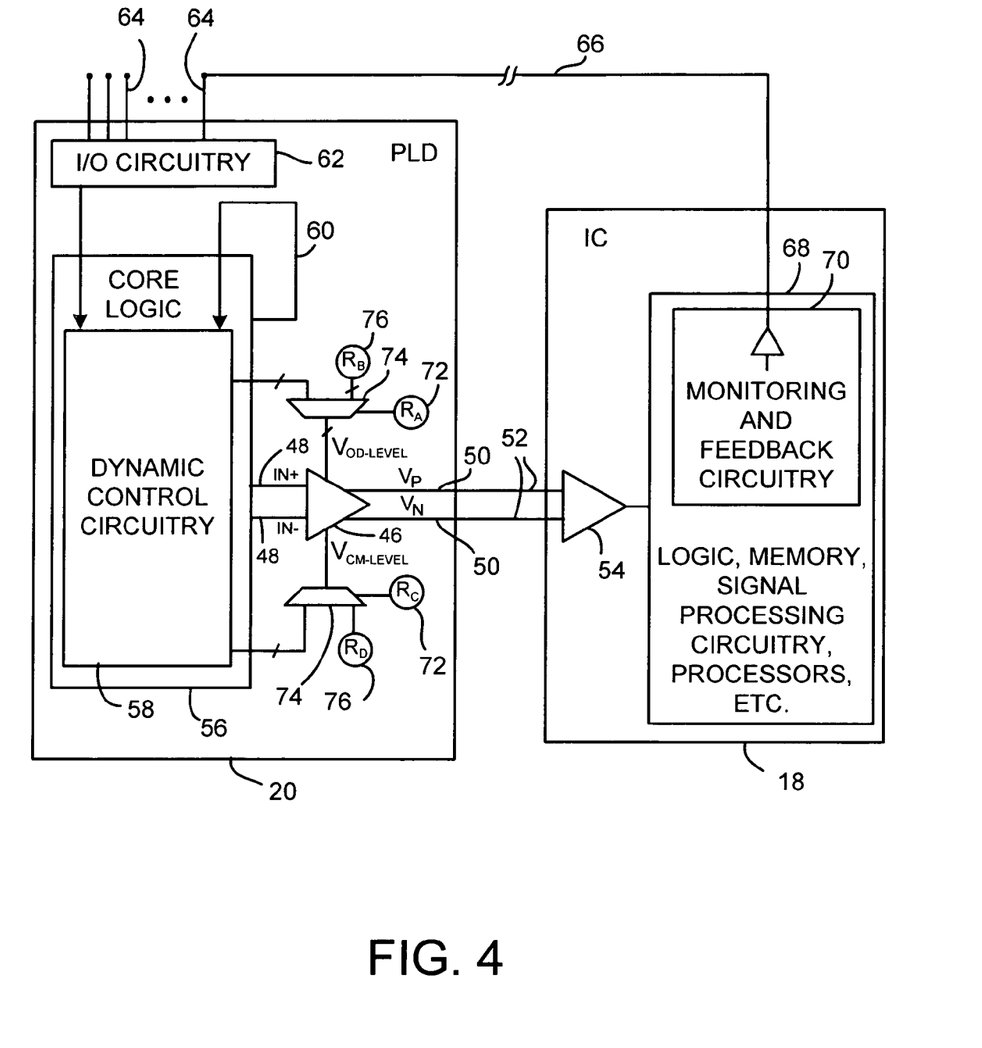
FIG. 4 is a diagram of a portion of a system in which first and second integrated circuits communicate over a differential signal path in accordance with the present invention.

An illustrative portion of system 10 in which a first integrated circuit (PLD 20) is in communication with a second integrated circuit (IC 18) is shown in FIG. 4. Programmable logic device 20 has an adjustable differential output driver 46. Differential output driver 46 may be adjusted to provide output signals with desired static values of $V_{OD}$ and $V_{CM}$ or may be controlled dynamically in real time to produce output data signals with desired $V_{OD}$ and $V_{CM}$ attributes.

In the illustrative arrangement of FIG. 4, differential output driver 46 receives output data in differential form on input terminals IN+ and IN−. The data that is received at terminals IN+ and IN− may be any suitable data from PLD 20 that it is desired to communicate to other system components.

The differential output driver 46 provides the output data in differential form across output terminals 50 (labeled $V_P$ and $V_N$). The output data is conveyed from programmable logic device 20 to integrated circuit 18 over communications path 52. Path 52 may be based on a pair of parallel conductive differential signal traces on circuit board or any other suitable path through system 10.

Integrated circuit 18 includes a differential input driver 54 for receiving and processing the output data from programmable logic device 20. Input driver 54 may, for example, convert high-speed differential input signals from differential signal channel 52 into single-ended digital data signals for used by the internal circuitry of integrated circuit 18.

Programmable logic device 20 may have core logic 56. The core logic 56 may contain programmable logic that a user can program to perform a desired custom logic function. Programmable logic device 20 may also contain dynamic control circuitry 58 for controlling differential output driver 46 in real time. Static control functions (in which the $V_{CM}$ and $V_{OD}$ settings of output driver 46 are set based on static default values or static user-selected values) can be performed using control circuitry 58.

Control circuitry 58 may be implemented using the fixed and programmable circuit resources of core logic 56. These resources may include logic such as counters, macrocells, array logic, multipliers, registers, etc. These resources may also include processor circuitry, memory circuitry, and special-purpose resources. The functions of control circuitry 58 may, if desired, be implemented by programming programmable logic device 20 with suitable configuration data to direct programmable logic device 20 to configure a portion of its resources to form the desired control circuit. In this sense, the functions of control circuitry 58 may be implemented at least in part by using loadable programming data. Some circuit functions of circuitry 58 may also be implemented by executing instructions that are loaded into memory in programmable logic device 20.

When a microprocessor, digital signal processor, or other processor-based device that executes control instructions contains adjustable output drivers such as driver 46, some or all of the dynamic control functions of circuitry 58 may be implemented by using the general-purpose capabilities of that device (i.e., capabilities that are implemented by executing the instructions with processing circuitry). An application-specific integrated circuit or other integrated circuit having an adjustable differential output driver such as driver 46 may use a hard-wired circuit implementation of dynamic control circuitry 58.

These are merely illustrative arrangements for implementing dynamic control circuitry 58 on different types of integrated circuit. Any suitable arrangement may be used if desired.

Regardless of the particular arrangement used for dynamic control circuitry 58, circuitry 58 may be responsive to internally-generated signals (e.g., signals received from other portions of core logic via internal lines such as line 60) and may be responsive to externally-supplied signals (e.g., signals received by programmable logic device 20 from external sources such as integrated circuit 18).

Signals from external sources may be provided to dynamic control circuitry 58 via I/O circuitry 62 and associated input pins 64. Pins such as pins 64 may also be used to load configuration data for programming dynamic control circuitry 58 and/or providing output driver settings to circuitry 58 for use in adjusting output driver circuitry 46.

The information that is provided to dynamic control circuitry 58 from external sources may include any information from a system component in system 10 or a source external to system 10. With the illustrative arrangement shown in FIG. 4, the external data provided to dynamic control circuitry 58 via input pin 64 and I/O circuitry 62 may be information on a desired $V_{CM}$ level for the input driver 54 or other information or feedback data that may be provided to programmable logic device 10 by integrated circuit 18 via path 66. Path 66 may be a single-line path, a path that includes multiple parallel data lines, a path for analog feedback signals, a path for digital feedback signals, a path for parallel data or serial data, a single-ended or differential path, combinations of such paths or any other suitable path for feedback information for circuit 18.

The type of structure that is used for paths such as path 66 depends on the type of data that is being provided. For example, if feedback data is being provided that includes digital information that dynamic control circuitry 58 processes digitally to determine how to control differential output buffer 46, the path 66 preferably includes an appropriate number of data lines to convey this information from integrated circuit 18 to dynamic control circuitry 58 in real time so that dynamic control circuitry 58 may adjust differential output buffer 46 in real time. As an example, the path 66 and dynamic control circuitry 58 may make adjustments to the output driver settings 1000s of times per second. With other suitable arrangements, adjustments may be made more frequently (e.g., 10s or 100s of thousands of times per second or more) or may be made less frequently (e.g., once per second or once per minute, etc.).

These adjustments may be made continually and automatically based on the control functions implemented using dynamic control circuitry 58, without reprogramming programmable logic device 20. The dynamic control arrangement therefore allows the performance of the differential output buffer to be optimized continuously, without requiring a system designer to predict all of the details of a particular system environment before the system is assembled.

Moreover, the dynamic control arrangement allows the programmable logic device to respond to changes in the system environment. For example, if a board 16 is added to the system or is removed from the system, the attenuation of a particular path may change. Dynamic control circuitry 58 can automatically adjust to this change in the system environment, without any need for the user to reprogram programmable logic device 20.

Integrated circuit 18 may be any suitable type of integrated circuit, such as a programmable logic device, digital signal processor, microprocessor, microcontroller, analog circuit, digital circuit, application-specific integrated circuit, memory device, logic circuit, etc. The portion of integrated circuit 18 that is used to provide the logic, memory, signal processing and other functions of circuit 18 is shown as circuitry 68. Circuitry 68 may include monitoring a feedback circuitry 70 for providing feedback information or other information on device settings such as input driver common-mode voltage level settings to the dynamic control circuitry 58 of programmable logic device 20 over path 66.

The type of monitoring and feedback circuitry 70 that is used in integrated circuit 18 depends on the type of control scheme being used by programmable logic device 20.

With one suitable approach, circuitry 70 provides circuitry 58 with information on the common-mode voltage level being used by input driver 54 (e.g., an optimum, desired, or expected common-mode voltage level or setting for that driver). Control circuitry 58 can adjust the output driver 46 accordingly, so that the $V_{CM}$ of the output data signals matches the input driver common-mode voltage level.

With another suitable approach, the monitoring and feedback circuitry 70 provides raw feedback data to dynamic control circuitry 58. For example, the monitoring and feedback circuitry 70 may provide information on the measured $V_{OD}$ and $V_{CM}$ levels at the inputs to differential input driver 54. (Measurements of $V_{OD}$ and $V_{CM}$ may be made by circuitry within the input driver 54 and/or external circuitry such as circuitry within monitoring and feedback circuitry 70.) This type of approach may be used, for example, to provide dynamic control circuitry 58 with information on the common-mode voltage of the differential output data signals at the receiver, so that the dynamic control circuitry 58 can accurately adjust differential output driver 46 to produce a value of $V_{CM}$ that reduces or eliminates mismatch between the $V_{CM}$ of the output data signals and the $V_{CM}$ level used at the receiver.

With yet another suitable approach, monitoring and feedback circuitry 70 performs significant processing functions. For example, monitoring and feedback circuitry 70 may include circuitry for analyzing the signal-to-noise ratio of the incoming data signals on differential communications path 52. When the incoming data signals have too much noise, the dynamic control circuitry 58 can automatically adjust the output driver 46 to compensate (e.g., by increasing $V_{OD}$).

These are merely illustrative approaches that may be used to provide suitable feedback signals from integrated circuit 18 to programmable logic device 20. Any suitable feedback approach may be used if desired.

Moreover, the internal signals provided to dynamic control circuitry 58 from core logic 56 via line 60 may, if desired, be combined with externally-received signals from line 66. With this type of approach, the dynamic control circuitry 58 can respond to raw data (e.g., measured values of the data signal $V_{CM}$ as received at the receiver) and processed data (e.g., information that is proportional to receiver noise levels) from integrated circuit 18 and may respond to internal data (e.g., clock and date values, internal logic conditions, etc.).

The differential output driver 46 of programmable logic device 20 may be controlled using any suitable control arrangement. With the illustrative arrangement shown in FIG. 4, control signals $V_{OD}$-LEVEL and $V_{CM}$-LEVEL are provided to driver 46 by dynamic control circuitry 58 to establish the desired peak-to-peak output voltage level $V_{OD}$ and common-mode voltage $V_{CM}$ for driver 46. The control signals $V_{OD}$-LEVEL and $V_{CM}$-LEVEL may be provided to driver 46 in any suitable format such as in an analog format or in a multi-bit digital format (provided serially on one or more control lines or provided in parallel on one or more control lines).

Switch circuitry such as multiplexers 74 may be used to selectively apply the control signals from the dynamic control circuitry to the differential output driver. Multiplexers 74 may be controlled by the configuration data loaded into storage elements such as RAM cells 72 or may be controlled by any other suitable control information. When the RAM bits of cells 72 are set in one way, the multiplexers 74 are configured to direct the control signals from dynamic control circuitry 58 to the differential output driver 46. When the RAM bits of cells 72 are set in another way, the multiplexers 74 are configured to direct stored data from RAM cells 76 (or other suitable storage) to differential output driver 46. The configuration RAM cells 72 may be programmed during device programming (i.e., when the programming data is loaded into programmable logic device 20 from EPROM 22 or when programmable logic device 20 is otherwise programmed).

When the configuration RAM cells 72 are provided with data that directs multiplexers 74 to apply the control information stored in RAM cells 76 to output driver 46, the control data for output driver 46 may be considered to be "static." This is because users typically reprogram programmable logic devices infrequently (or never) after an initial series of programming operations have been completed upon device set up. The RAM cells 76 may provide static values for $V_{OD}$-LEVEL and $V_{CM}$-LEVEL to output driver 46. These static settings may be default settings that are provided by the device manufacturer or may be user-specified settings that are selected when a user programs the appropriate configuration data into programmable logic device during device programming.

When the configuration RAM cells 72 are provided with data that directs multiplexers 74 to apply the control signals from dynamic control circuitry 58 to output driver 46, output driver 46 may be controlled in real time according to the control functions implemented in dynamic control circuitry 58. If desired, control circuitry 58 may be used for static (or pseudo-static) control operations in place of or in combination with using the static control capabilities of RAM cells 72 and 76 and multiplexers 74. When control circuitry 58 is used in place of multiplexers 74 and RAM cells 72 and 76, appropriate RAM cells or other logic within the control circuitry 58 may be used to generate and apply the appropriate static control signals to differential output driver 46.

Figure 5:
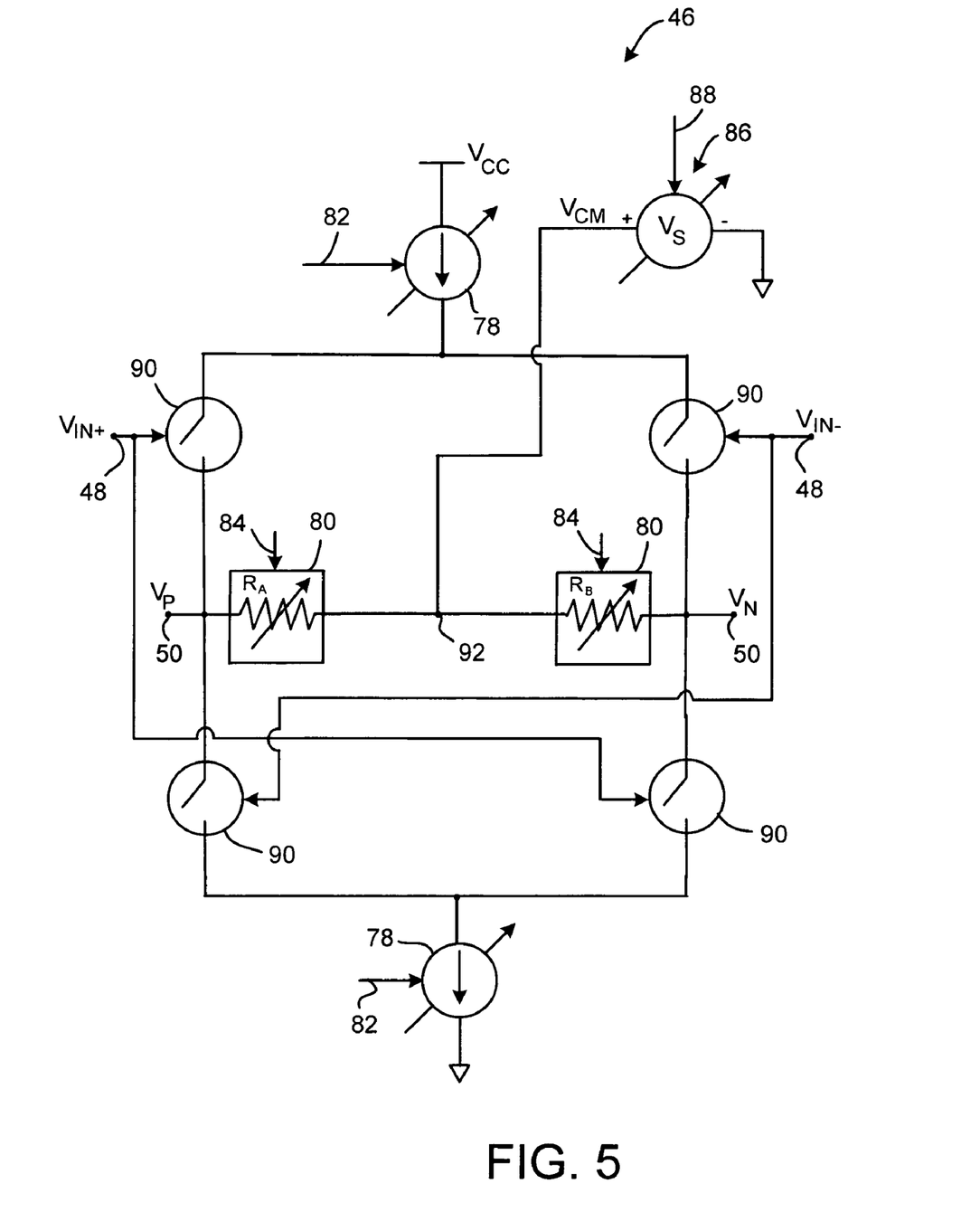
FIG. 5 is a circuit diagram of an illustrative adjustable differential output driver having capabilities for adjusting its common-mode voltage and differential output voltage in accordance with the present invention.

An illustrative differential output driver 46 is shown in FIG. 5. As shown in FIG. 5, output driver 46 may have adjustable current sources 78 and adjustable resistors 80. Current sources 78 may be adjusted via control terminals 82. Resistors 80 may be adjusted via control terminals 84. The output driver 46 may also have an adjustable voltage source 86. The level of the output voltage supplied by voltage source 86 may be controlled using control input 88.

Dynamic control circuitry 58 (with or without the assistance of additional control and processing circuitry within differential output buffer 46) may adjust the control signals $V_{OD}$-LEVEL and $V_{CM}$-LEVEL by adjusting the control signals applied to control lines 82, 84, and 86. For example, when a higher level of $V_{CM}$ is desired, the dynamic control circuitry directs voltage source 86 to produce a larger output voltage. This output voltage (labeled $V_{CM}$ in FIG. 5) is applied to node 90 and establishes the common-mode voltage for the output data signals from differential output driver 46.

As another example, when a higher level of peak-to-peak output voltage $V_{OD}$ is desired, the dynamic control circuitry directs the current source circuitry 78 and/or resistor circuitry 80 to increase their respective current and resistance values.

Any suitable approach may be used to adjust the current sources 78 and resistors 80 to control the peak-to-peak output voltage $V_{OD}$. It is generally desirable to adjust the resistances $R_A$ and $R_B$ of the resistors 80 so that the output impedance of driver 46 matches the impedance of communication path 50. If the system 10 is using a communications path 50 with (for example) a 50 ohm connection (as may be the case, for example, when coaxial cables are included in path 50), the output resistance is set to 50 ohms.

After the output impedance has been set appropriately, the current sources 78 may be adjusted independently to ensure that the value of $V_{OD}$ is set appropriately. The current sources 78 may be held at a constant static value (e.g., to implement a default or user-selected static set-up arrangement) or may be adjusted dynamically in real time by dynamic control circuitry 58. For example, the current sources 78 may be continually adjusted to supply more or less current as needed, based on dynamic real-time control signals from dynamic control circuitry 58. These control signals may be generated based on feedback information received by control circuitry 58 from integrated circuit 18 over feedback path 66.

The illustrative differential output driver 46 of FIG. 5 is driven by differential input data signals received from core logic 56 (FIG. 4) via the $V_{IN+}$ and $V_{IN-}$ input terminals. These differential input signals serve as control signals for the four switches of switch circuitry 90. Switches 90 may each be based on one or more switch devices such as metal-oxide-semiconductor transistors or any other suitable switch circuitry.

When a signal is received at terminal $V_{IN+}$, the upper left and lower right switches 90 are activated, which steers current from the upper current source 78 through resistors 80 to the lower current source 78. The magnitude of the current sources is typically set to be equal, so that in the absence of a positive signal on input terminal $V_{IN-}$, the current produced by the upper current source flows across resistors $R_A$ and $R_B$ (which are generally equal in magnitude) and produces a corresponding positive output signal across terminals $V_P$ and $V_N$. When a signal is present on input terminal $V_{IN-}$ and no signal is present on $V_{IN+}$, the upper right and lower left switches 90 are activated, and current flows in the opposite direction across resistors $R_A$ and $R_B$.

The differential output data signal produced across terminals $V_P$ and $V_N$ therefore follows the differential input signal provided across terminals $V_{IN+}$ and $V_{IN-}$. The common mode voltage of the output signal is set by the value of $V_{CM}$ that is supplied to node 92 by voltage source 86. The magnitude of the peak-to-peak output voltage swing $V_{OD}$ is established by the product of the magnitude of the output resistance ($R_A+R_B$) with the magnitude of the current provided by current sources 78.

Both the resistance of resistors 80 and the current of current sources 78 may be adjusted to control $V_{OD}$, although there is often a desire to match the output resistance of the differential driver 46, so that the impedance of the driver matches the line impedance. In this situation, the output resistance of the driver is determined by the line impedance constraint and remaining $V_{OD}$ adjustments may be made by independently adjusting the magnitude of the current sources 78.

Any suitable circuit arrangements may be used for programmable current sources 78, programmable resistors 80, and programmable voltage supply 86. With one illustrative current source arrangement, the magnitude of the current source is established by turning on a current source transistor in proportion to the current source setting. When the current source transistor is turn on forcefully, the current is greatest. When the control signal applied to the current source transistor is weaker, the current produced by the current source is correspondingly less. Another illustrative current source arrangement uses multiple transistors in parallel. The number of transistors that are turned on determines the current. These are merely illustrative current source arrangements that may be used. Any suitable current source circuitry may be used if desired.

Figure 6:
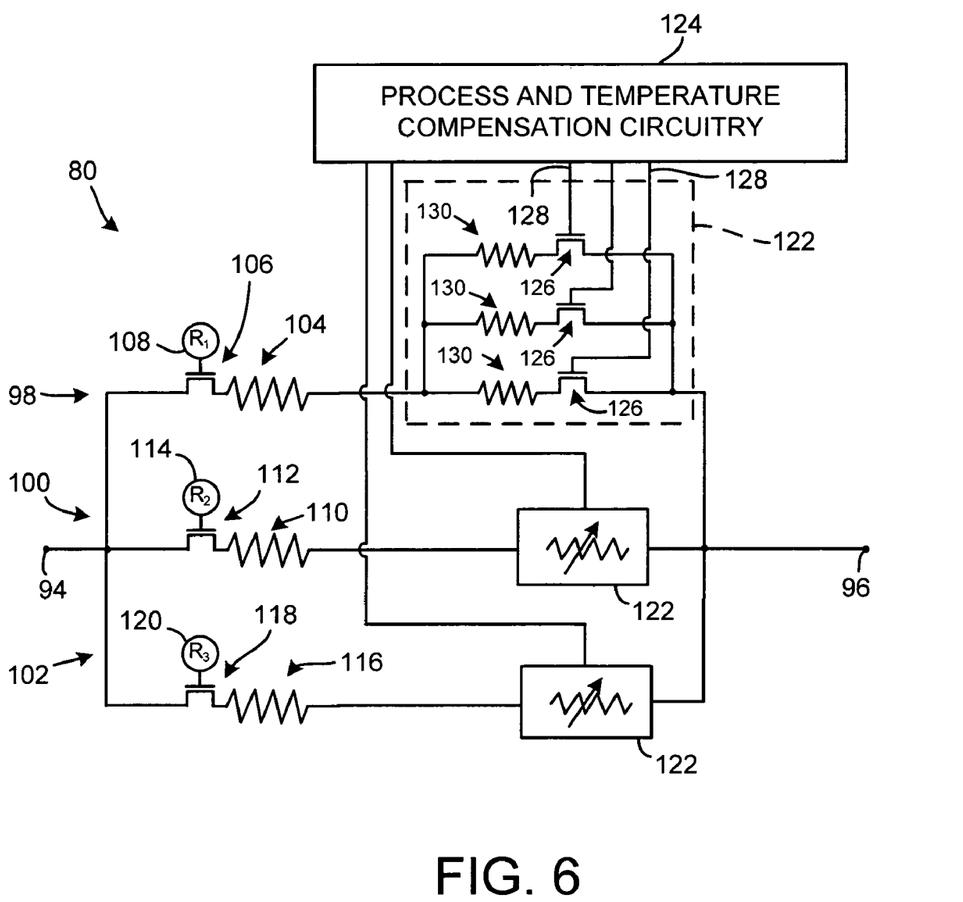
FIG. 6 is a circuit diagram of an illustrative programmable resistor that may be used in the output stage of the differential output driver in accordance with the present invention.

An illustrative controllable resistor arrangement that may be used is shown in FIG. 6. The controllable resistor circuitry 80 of FIG. 6 may be used to produce a controlled amount of resistance between terminals 94 and 96. Resistor 80 may have a number of parallel paths. In the example of FIG. 6, there are three parallel paths 98, 100, and 102. Each parallel path may contain a primary resistor and an associated switch such as a transistor controlled by a corresponding RAM bit or other suitable control arrangement. In the variable resistor circuit of FIG. 6, for example, path 98 has a primary resistor 104 and an associated transistor 106. Transistor 106 is turned on or off by the value of the data bit stored in RAM control cell 108. If the data stored in cell 108 is high, transistor 106 is turned on and the circuitry in path 98 is electrically connected between terminal 94 and 96. If the data stored in cell 108 is low, transistor 106 is turned off, which isolates the components in path 98 from terminals 94 and 96. Paths 100 and 102 have similar circuitry. Path 100 has a primary resistor 110 that is either switched into use or withheld from use by controlling transistor 112 via RAM cell 114. Path 102 has a resistor 116 that is either switched into use or isolated from the circuit by transistor 118, which is controlled by an associated RAM cell 120.

Primary resistors 104, 110, and 116 may have the same values or different values. In one suitable arrangement, each resistor has a different value that is associated with a commonly used nominal output impedance value for output driver 46 (e.g., 50 ohm, 60 ohm, or 75 ohm). Adjustments to the resistance setting for controllable resistor 80 may be made by providing the appropriate control data to RAM cells 108, 114, and 120 and thereby turning off the unneeded paths through resistor 80 while permitting current to flow through the path or paths associated with the desired resistance value. If desired, control data may be applied to the appropriate transistors directly from dynamic control circuitry 58 without using RAM cells 108, 114, and 120.

Additional resistance value adjustments may be made using the associated variable resistor 122 in the remaining portion of the selected path (or paths). Each variable resistor 122 may be controlled by process and temperature compensation circuitry 124. Circuitry 124 controls transistors 126 via control lines 128. A number of parallel paths may be provided within each variable resistor 122. Each path may have a resistor 130. Process and temperature compensation circuitry 124 has circuitry whose output control signals on lines 128 vary according to the current temperature of the variable resistor 80 and that vary according to manufacturing process variations. The control signals are used to compensate for process and temperature variations, so that the circuit 80 is insensitive to these sources of error in the overall resistance value.

In particular, if the temperature of the resistor rises or falls during operation of programmable logic device 20 or if the process of manufacturing programmable logic device systematically introduced sources of error into the values of the resistances in resistor 80, circuitry 124 automatically generates compensating control signals that turn on the appropriate number of transistor 126 in each resistor 122 to make the overall resistance of resistor 80 temperature and process invariant. When more resistors 130 are switched into use (by turning on more transistors 126 via control lines 128), the resistance of the resistor 122 drops, thereby compensating for a temperature-induced or process-induced rise in resistance. When fewer resistors 130 are switched into use (by turning off more transistors 126 via control lines 128), the resistance of each variable resistor 122 drops, thereby compensating for a drop in resistance caused by temperature or process variations.

The arrangement of FIG. 6 therefore allows the dynamic control circuitry 58 to accurately select the desired resistances for $R_A$ and $R_B$ by connecting the desired path or parallel paths into the circuit between terminal 94 and 96. Process and temperature compensation circuitry 124 and corresponding variable resistors 122 may be used to make corrective resistance adjustments that ensure that the selected resistance is accurate and is not adversely affected by temperature and process variations.

Figure 7:
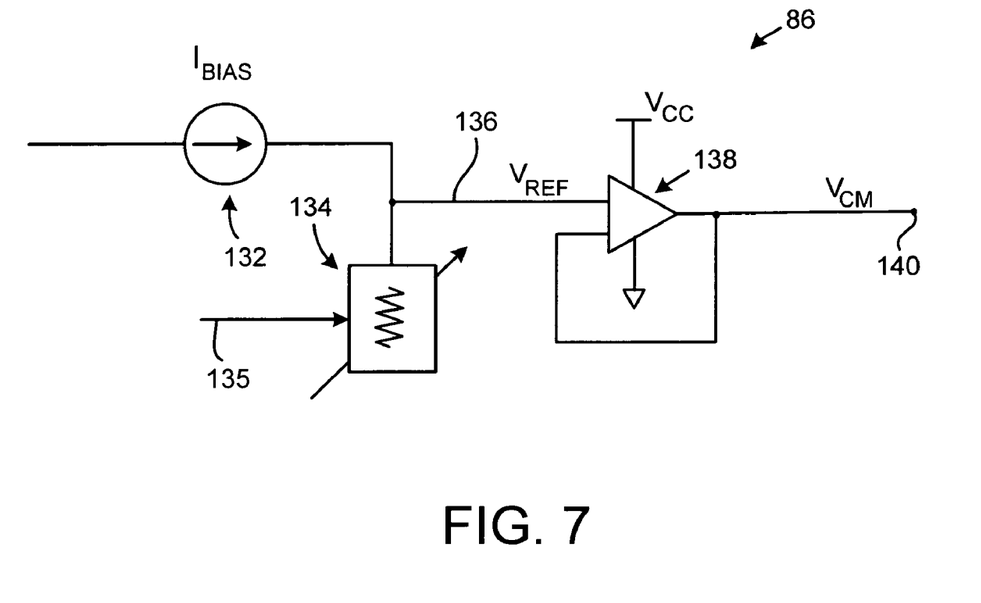
FIG. 7 is a circuit diagram of an illustrative common-mode voltage source that may be used in an adjustable differential output driver in accordance with the present invention.

An illustrative programmable voltage source that may be used for voltage source 86 of FIG. 5 is shown in FIG. 7. Voltage source 86 may have a current source such as current source 132 for biasing resistor 134. The resistance of resistor 134 may be controlled by dynamic control circuitry 58 via control signals applied to control line 135. The product of the bias current $I_{BIAS}$ and the resistance $R_{REF}$ of resistor 134 sets the value of the reference voltage $V_{REF}$ ($V_{REF} = I_{BIAS} * R_{REF}$) at reference voltage line 136. Operational amplifier circuit 138 may be used as an output stage for voltage source 86. The resulting output voltage level $V_{CM}$ at output node 140 is equal to the voltage reference $V_{REF}$. As shown in FIG. 5, this voltage may be applied to node 92 of differential output driver 46 to establish the common-mode output voltage of the signals produced by driver 46.

Figure 8:
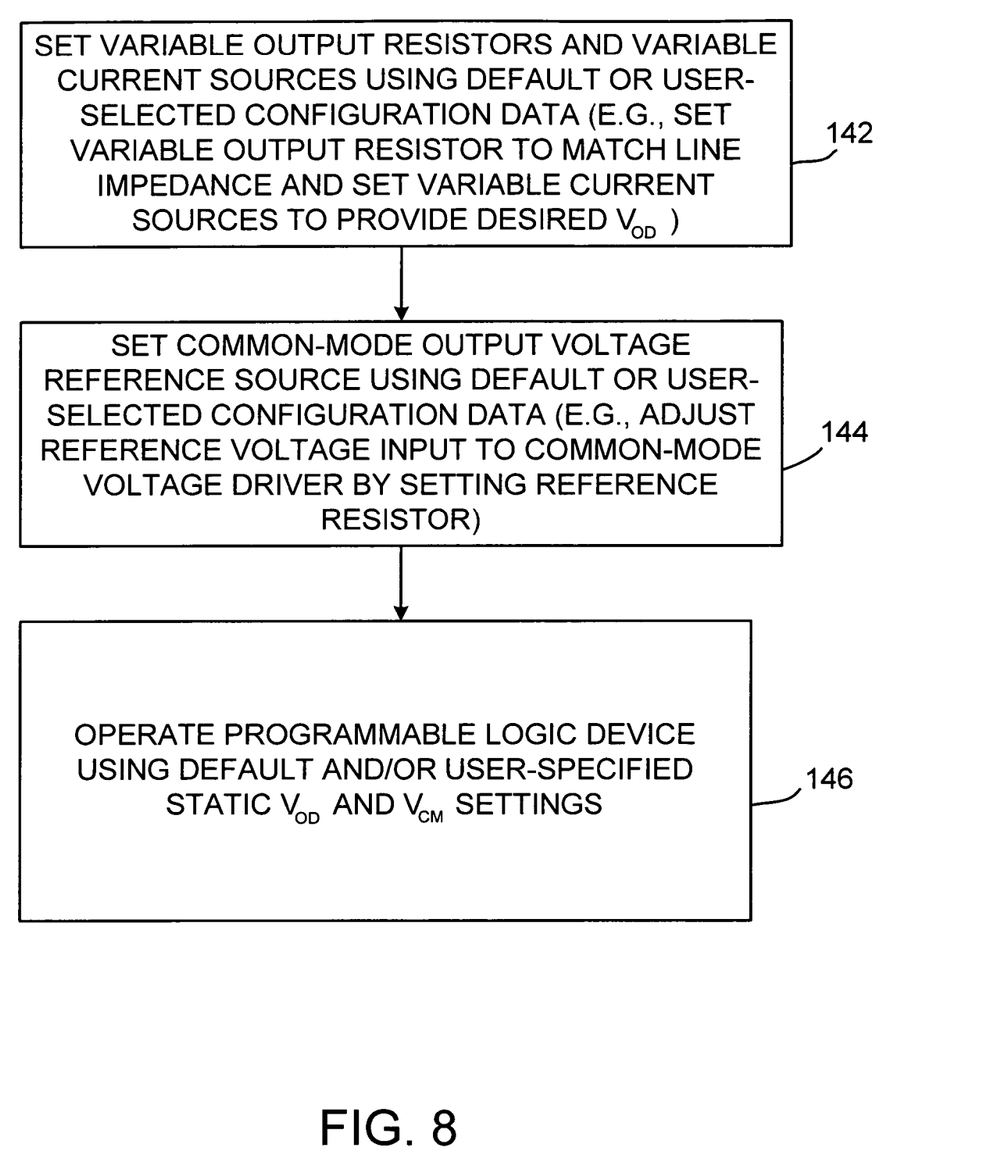
FIG. 8 is a flow chart of illustrative steps involved in using a differential output driver that has been set to operate at a particular common-mode output voltage and differential output voltage in accordance with the present invention.

Illustrative steps involved in using an integrated circuit with adjustable differential output driver circuitry to establish default or user-specified static (or pseudo-static) settings for $V_{CM}$ and/or $V_{OD}$ are shown in FIG. 8. At step 142, the variable output resistors $R_A$ and $R_B$ and the current sources 78 are set to appropriate levels. For example, the resistances of resistors $R_A$ and $R_B$ may be adjusted so that the output impedance of the differential output driver matches the impedance of the differential communications path to which the differential output driver is connected. The variable current source may then be adjusted independently as needed to provide the appropriate level of peak-to-peak output voltage ($V_{OD}$).

At step 144, the common-mode output voltage for the differential output driver may be set. For example, adjustable voltage source 86 (FIG. 5) may be used to set the value of $V_{CM}$ for the output driver.

The adjustable resistors, current sources, and voltage source that are adjusted at steps 142 and 144 may be controlled by control signals provided by one or more RAM cells or other circuit elements into which data has been loaded (e.g., during device programming). These adjustable components may also be controlled by control signals provided by control circuitry such as control circuitry 58 of FIG. 4. Default settings may be included in a default portion of the configuration data that is loaded into programmable logic device 20 during programming. User selections of settings may be made when a user interacts with programming software prior to device programming. The programming software can then generate appropriate configuration data that may be stored (for example) in an external circuit component such as EPROM 22 (FIG. 1). When programmable logic device 20 is programmed, the configuration data (including the default settings and/or the user-selected output driver settings for $V_{OD}$ and/or $V_{CM}$) may be loaded into programmable logic device (e.g., into RAM cells or other memory, etc.).

At step 146, the programmable logic device can be operated using the settings that have been established for the differential output driver. The control signals (whether from RAM cells such as cells 76 of FIG. 4 or whether from a control circuit such as control circuitry 58) control the adjustable resistors, current sources, and voltage source appropriately to produce the desired default or user-selected levels for $V_{OD}$ and $V_{CM}$ of the adjustable differential output driver.

Figure 9:
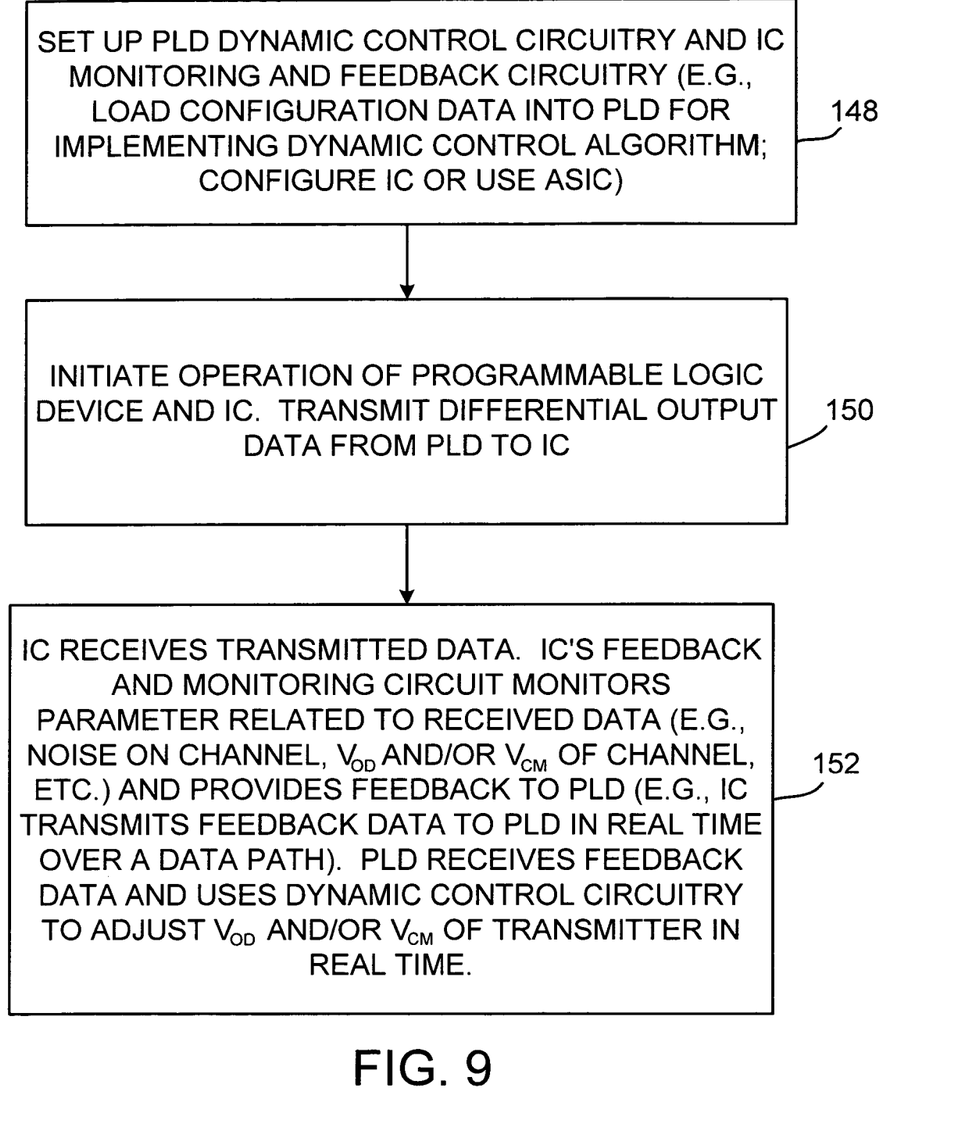
FIG. 9 is a flow chart of steps involved in dynamically controlling a differential output driver in real time by changing its common mode voltage and/or differential output voltage based on external signals and/or local signals in accordance with the present invention.

Illustrative steps involved in controlling the common-mode voltage and differential output voltage settings of one or more differential output drivers in real time using dynamic control circuitry are shown in FIG. 9.

The process of FIG. 9 may involve a first integrated circuit (e.g., the circuit on which one or more differential output drivers are located) and one or more additional integrated circuits (e.g., a second circuit that receives differential output data from the first integrated circuit). With one illustrative arrangement, the first integrated circuit receives information such as feedback information from the second integrated circuit (and from the other integrated circuits if more are involved). The first integrated circuit uses the received information in controlling operation of the differential output drivers. Differential output drivers for different data channels may be controlled independently to optimize performance.

The first integrated circuit may include dynamic control circuitry that receives external information such as feedback signals from monitoring and feedback circuitry on the second integrated circuit. The dynamic control circuitry adjusts the values of the peak-to-peak output voltage $V_{OD}$ and the common-mode voltage $V_{CM}$ for the differential output data signals produced by the differential output driver(s) based on the feedback signals and other information received from the second integrated circuit (and any other integrated circuits providing such information).

The first and second integrated circuits may be any suitable types of integrated circuit. With one suitable arrangement (which is used in connection with FIG. 9 as an example), the first integrated circuit is a programmable logic device and the second integrated circuit is an application specific integrated circuit, processor, or other suitable integrated circuit that communicates with the first integrated circuit over a differential communications path. Although there may be more than one "second" integrated circuit, the method of FIG. 9 is described in the context of a single such circuit for clarity.

At step 148 of FIG. 9, the first and second integrated circuits are set up (if appropriate). For example, if the first integrated circuit is a configurable circuit such as a programmable logic device, step 148 may be used to set up the dynamic control circuitry in the programmable logic device. The functions of the dynamic control circuitry may be implemented using (at least partly) programmable circuitry that is configured during device programming by loading appropriate configuration data into RAM cells (or other suitable programmable circuit elements) in the programmable logic device. The second integrated circuit may have monitoring and feedback circuitry to be configured (e.g., if the second integrated circuit is a programmable logic device or a processor for which a particular feedback algorithm should be loaded). These set up operations may also be performed during set up step 148.

At step 150, once the set up operations of step 148 have been completed, the operation of the first and second integrated circuits may be initiated. As an example, the programmable logic device 20 may begin transmitting differential output data to the second integrated circuit over the differential communications path.

At step 152, the second integrated circuit may receive the transmitted differential output data from the first integrated circuit. The monitoring and feedback capabilities of the second integrated circuit may be used to gather feedback information that is indicative of how the output driver circuitry of the first integrated circuit should be adjusted. For example, monitoring and feedback circuitry on the second integrated circuit may be used to measure the $V_{CM}$ of the received data signals at the receiver on the second integrated circuit. Monitoring and feedback circuitry may also be used to measure parameters such as signal-to-noise ratio or signal strength. These are merely illustrative examples of the types of parameters that may be gathered by the monitoring and feedback circuitry. Any suitable information may be gathered if desired.

During step 152, the feedback information that has been gathered or other information such as input driver common-mode voltage settings, etc. may be provided to the first integrated circuit. For example, monitoring and feedback circuitry on the second integrated circuit may be used to transmit raw or processed feedback signals (data related to the operation of the differential input driver on the second integrated circuit). The transmitted signals may serve as feedback information for the first integrated circuit. The transmitted signals may be provided from the second integrated circuit to the first integrated circuit over any suitable data path (e.g., a system bus, conductive paths on a circuit board on which the first and second integrated circuits are mounted, high-speed or low-speed conductive traces, etc.). When there are multiple data channels involved, information such as feedback signals may be transmitted back to the first circuit for each separate data channel so that each data channel may be adjusted independently.

The feedback may be received by the first integrated circuit using I/O circuitry and the dynamic control circuitry on the first integrated circuit. The dynamic control circuitry may process the feedback information and may adjust the $V_{OD}$ and $V_{CM}$ settings of the differential output driver on the first integrated circuit dynamically in real time. For example, 1 or more, 10 or more, 100 or more, 1000 or more, or 10,000 or more $V_{OD}$ and/or $V_{CM}$ setting adjustments may be made automatically and continuously each second. If desired, these adjustments may also be made more slowly, depending on the type of control algorithm that is being used or may be made whenever certain conditions occur (e.g., whenever the circuit board configuration in the system 10 is changed).

The foregoing is merely illustrative of the principles of this invention and various modifications can be made by those skilled in the art without departing from the scope and spirit of the invention.

What is claimed is:

1. Dynamically adjustable differential output driver circuitry on an integrated circuit that transmits differential output data signals that have a peak-to-peak output voltage swing $V_{OD}$, comprising:
   adjustable current source circuitry;
   adjustable resistor circuitry;
   switching circuitry for switching current from the adjustable current source circuitry through the adjustable resistor circuitry to produce the differential output signals, wherein the adjustable current source circuitry and adjustable resistor circuitry are controlled independently in real time by control signals to adjust the peak-to-peak output voltage swing $V_{OD}$ of the differential output data signals; and
   dynamic control circuitry that generates the control signals, wherein the dynamic control circuitry is implemented at least partly using programmable logic circuitry, wherein the resistor circuitry comprises process and temperature compensation circuitry to compensate for process-induced and temperature-induced resistivity changes in the resistor circuitry, wherein the resistor circuitry comprises a plurality of variable resistors, and wherein each variable resistor comprises a plurality of parallel paths each having an associated resistor.

2. An integrated circuit having:

an adjustable differential output driver that produces differential output data signals having a common mode voltage that are transmitted to another integrated circuit; and control circuitry that controls the adjustable differential output driver to adjust the common mode voltage in response to feedback received from the other integrated circuit, wherein the adjustable differential output driver includes adjustable programmable resistor circuitry and programmable current source circuitry that are independently adjusted.

3. The integrated circuit defined in claim 2 further comprising programmable core logic.

4. The integrated circuit defined in claim 2 further comprising programmable core logic in which at least part of the control circuitry is implemented.

5. An integrated circuit having:

an adjustable differential output driver that produces differential output data signals having a common mode voltage that are transmitted to another integrated circuit; and control circuitry that controls the adjustable differential output driver to adjust the common mode voltage in response to feedback received from the other integrated circuit, wherein the control circuitry comprises control circuitry that controls the adjustable differential output driver to adjust the common mode voltage in response to information that is based at least partially on a mismatch between the common mode voltage of the differential output data signals produced by the adjustable differential output driver at the integrated circuit and a common mode voltage measured for the differential output data signals when the differential output data signals are received at the other integrated circuit.

6. The integrated circuit defined in claim 5 wherein the adjustable differential output driver includes adjustable programmable resistor circuitry.

7. The integrated circuit defined in claim 5 wherein the adjustable differential output driver includes adjustable programmable current source circuitry.

8. The integrated circuit defined in claim 5 wherein the adjustable differential output driver includes adjustable programmable resistor circuitry and programmable current source circuitry.

9. An integrated circuit having:

an adjustable differential output driver that produces differential output data signals having a common mode voltage that are transmitted to another integrated circuit; and control circuitry that controls the adjustable differential output driver to adjust the common mode voltage in response to feedback received from the other integrated circuit, wherein the control circuitry comprises control circuitry that uses the feedback to adjust the adjustable differential output driver to match the common-mode voltage of the differential output data signals to a common-mode voltage level for an input driver on the other integrated circuit.

10. An integrated circuit having:

an adjustable differential output driver that produces differential output data signals having a common mode voltage that are transmitted to another integrated circuit; and control circuitry that controls the adjustable differential output driver to adjust the common mode voltage in response to feedback received from the other integrated circuit, wherein the differential output driver sends the differential output signals over a differential data channel to the other integrated circuit and wherein there are a plurality of such differential data channels between the integrated circuit and the other integrated circuit, each channel having its own associated level of peak-to-peak output voltage swing for its associated differential output data signals, wherein the control circuitry independently adjusts the differential output driver in each channel to adjust the level of the peak-to-peak output voltage swing for each channel.

11. An integrated circuit having:

an adjustable differential output driver that produces differential output data signals having a common mode voltage that are transmitted to another integrated circuit; and control circuitry that controls the adjustable differential output driver to adjust the common mode voltage in response to feedback received from the other integrated circuit, wherein the adjustable differential output driver sends the differential output signals over a differential data channel to the other integrated circuit and wherein there are a plurality of such differential data channels between the integrated circuit the other integrated circuit, each channel having its own associated common-mode voltage for its associated differential output data signals, wherein the control circuitry independently adjusts the differential output driver in each channel to adjust the common-mode voltage for each channel.

* * * * *